United States Patent
Fernandez-Galindo et al.

(10) Patent No.: US 10,784,495 B2
(45) Date of Patent: Sep. 22, 2020

(54) SYSTEMS AND METHODS FOR PROVIDING INDIVIDUAL BATTERY CELL CIRCUIT PROTECTION

(71) Applicant: FORD GLOBAL TECHNOLOGIES, LLC, Dearborn, MI (US)

(72) Inventors: Francisco Fernandez-Galindo, Canton, MI (US); Daniel Paul Roberts, Livonia, MI (US); Vedat Haydin, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 16/135,127

(22) Filed: Sep. 19, 2018

(65) Prior Publication Data

US 2020/0091494 A1 Mar. 19, 2020

(51) Int. Cl.
| | |
|---|---|
| *H01M 2/34* | (2006.01) |
| *H01M 10/48* | (2006.01) |
| *G01R 31/36* | (2020.01) |
| *H02J 7/00* | (2006.01) |
| *H01M 2/20* | (2006.01) |

(52) U.S. Cl.
CPC ............ *H01M 2/348* (2013.01); *G01R 31/36* (2013.01); *H01M 2/202* (2013.01); *H01M 10/482* (2013.01); *H02J 7/0029* (2013.01)

(58) Field of Classification Search
CPC .... H01M 2/348; H01M 2/202; H01M 10/482; G01R 31/36; H02J 7/0029
USPC ......................................................... 320/134
See application file for complete search history.

(56) References Cited

U.S. PATENT DOCUMENTS

| | | | |
|---|---|---|---|
| 6,280,205 B1 * | 8/2001 | Murowaki | H05K 1/141 439/79 |
| 6,342,932 B1 * | 1/2002 | Terao | G02F 1/13452 349/150 |
| 6,414,299 B1 * | 7/2002 | Churei | G02B 7/02 250/201.2 |
| 7,189,929 B2 | 3/2007 | Benson | |
| 8,679,671 B2 * | 3/2014 | Witting | H01M 2/1077 429/158 |
| 9,692,031 B2 * | 6/2017 | Subramanian | H01M 2/206 |
| 10,040,294 B2 * | 8/2018 | Kimura | B41J 2/1752 |
| 10,158,106 B2 * | 12/2018 | Marpu | B60K 6/28 |
| 2011/0151315 A1 | 6/2011 | Masson et al. | |
| 2012/0019061 A1 | 1/2012 | Nishihara et al. | |
| 2015/0064516 A1 | 3/2015 | Swoish | |
| 2015/0072209 A1 | 3/2015 | Tyler et al. | |
| 2018/0076487 A1 * | 3/2018 | Lee | H01M 10/4257 |

* cited by examiner

*Primary Examiner* — M Baye Diao
(74) *Attorney, Agent, or Firm* — David B. Kelley; Carlson, Gaskey & Olds

(57) ABSTRACT

This disclosure details exemplary battery pack designs for use in electrified vehicles. Exemplary battery packs may include a sense lead assembly having a circuit board that is centrally mounted between first and second wiring members (e.g., flat flexibles cables or flat printed circuits). The circuit board establishes a suitable mounting surface for incorporating sense lead fuses into the sense lead assembly. The centralized sense lead fuses provide for simple and reliable servicing of the battery array in response to battery overcurrent conditions.

11 Claims, 5 Drawing Sheets

SYSTEMS AND METHODS FOR PROVIDING INDIVIDUAL BATTERY CELL CIRCUIT PROTECTION

TECHNICAL FIELD

This disclosure relates to electrified vehicle battery packs, and more particularly to sense lead assemblies and methods for protecting against overcurrent conditions within battery packs.

BACKGROUND

The desire to reduce automotive fuel consumption and emissions has been well documented. Therefore, electrified vehicles are being developed that reduce or completely eliminate reliance on internal combustion engines. In general, electrified vehicles differ from conventional motor vehicles because they are selectively driven by one or more battery powered electric machines. Conventional motor vehicles, by contrast, rely exclusively on the internal combustion engine to propel the vehicle.

A high voltage battery pack typically powers the electric machines and other electrical loads of the electrified vehicle. The battery pack includes a plurality of battery cells. The battery cells must be reliably connected to one another in order to achieve the necessary voltage and power levels for operating the electrified vehicle. Numerous parts, including but not limited to bus bars, wiring, and sensors, are typically required to electrically connect the battery cells.

SUMMARY

A battery array according to an exemplary aspect of the present disclosure includes, among other things, a sense lead assembly including a first wiring member including a first voltage sense lead, a circuit board connected to the first wiring member, and a first fuse mounted to the circuit board and connected to the first voltage sense lead.

In a further non-limiting embodiment of the foregoing battery array, the battery arrays includes a plurality of battery cells and the sense lead assembly electrically connects the plurality of battery cells.

In a further non-limiting embodiment of either of the foregoing battery arrays, the first wiring member is configured as a flat flexible cable or a flexible printed circuit.

In a further non-limiting embodiment of any of the foregoing battery arrays, the first voltage sense lead extends inside the flat flexible cable or is applied on an external surface of the flexible printed circuit.

In a further non-limiting embodiment of any of the foregoing battery arrays, a transition area is provided on a mounting surface of the circuit board and is connected between the first voltage sense lead and the first fuse.

In a further non-limiting embodiment of any of the foregoing battery arrays, the first wiring member connects between the circuit board and a plurality of bus bars.

In a further non-limiting embodiment of any of the foregoing battery arrays, at least one additional wire is connected between the circuit board and a sense lead connector.

In a further non-limiting embodiment of any of the foregoing battery arrays, the sense lead connector connects to an intermediate harness assembly or directly to a control module.

In a further non-limiting embodiment of any of the foregoing battery arrays, the circuit board includes at least one flexible retention arm for securing the circuit board to a plastic carrier of a circuit connector system.

In a further non-limiting embodiment of any of the foregoing battery arrays, the first voltage sense lead extends between a bus bar and the first fuse.

In a further non-limiting embodiment of any of the foregoing battery arrays, the sense lead assembly includes at least one thermistor.

In a further non-limiting embodiment of any of the foregoing battery arrays, the sense lead assembly includes a second wiring member having a second voltage sense lead.

In a further non-limiting embodiment of any of the foregoing battery arrays, the circuit board is centrally mounted between the first wiring member and the second wiring member.

In a further non-limiting embodiment of any of the foregoing battery arrays, a second fuse is mounted to the circuit board and is connected to the second voltage sense lead.

In a further non-limiting embodiment of any of the foregoing battery arrays, the sense lead assembly is a component of a circuit connector system that is mounted at a top surface of a battery array.

A method according to another exemplary aspect of the present disclosure includes, among other things, mounting a fuse to a circuit board of a sense lead assembly of a battery array circuit connection system. The fuse is configured to break a circuit established by a voltage sense lead of the sense lead assembly in response to a battery overcurrent condition.

In a further non-limiting embodiment of the foregoing method, the method includes removing the fuse from the circuit board in response to the battery overcurrent condition and replacing the fuse with a second fuse.

In a further non-limiting embodiment of either of the foregoing methods, the method includes a transition area provided on a mounting surface of the circuit board and that is connected between the voltage sense lead and the fuse.

In a further non-limiting embodiment of any of the foregoing methods, the method includes connecting the circuit board to a sense lead connector and connecting the sense lead connector to either a harness assembly or a control module.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure details exemplary battery pack designs for use in electrified vehicles. Exemplary battery packs may include a sense lead assembly having a circuit board that is centrally mounted between first and second wiring members (e.g., flat flexibles cables or flat printed circuits). The circuit board establishes a suitable mounting surface for incorporating sense lead fuses into the sense lead assembly. The centralized sense lead fuses provide for simple and reliable servicing of the battery array in response to battery overcurrent conditions. These and other features are discussed in greater detail in the following paragraphs of this detailed description.

Figure 1:
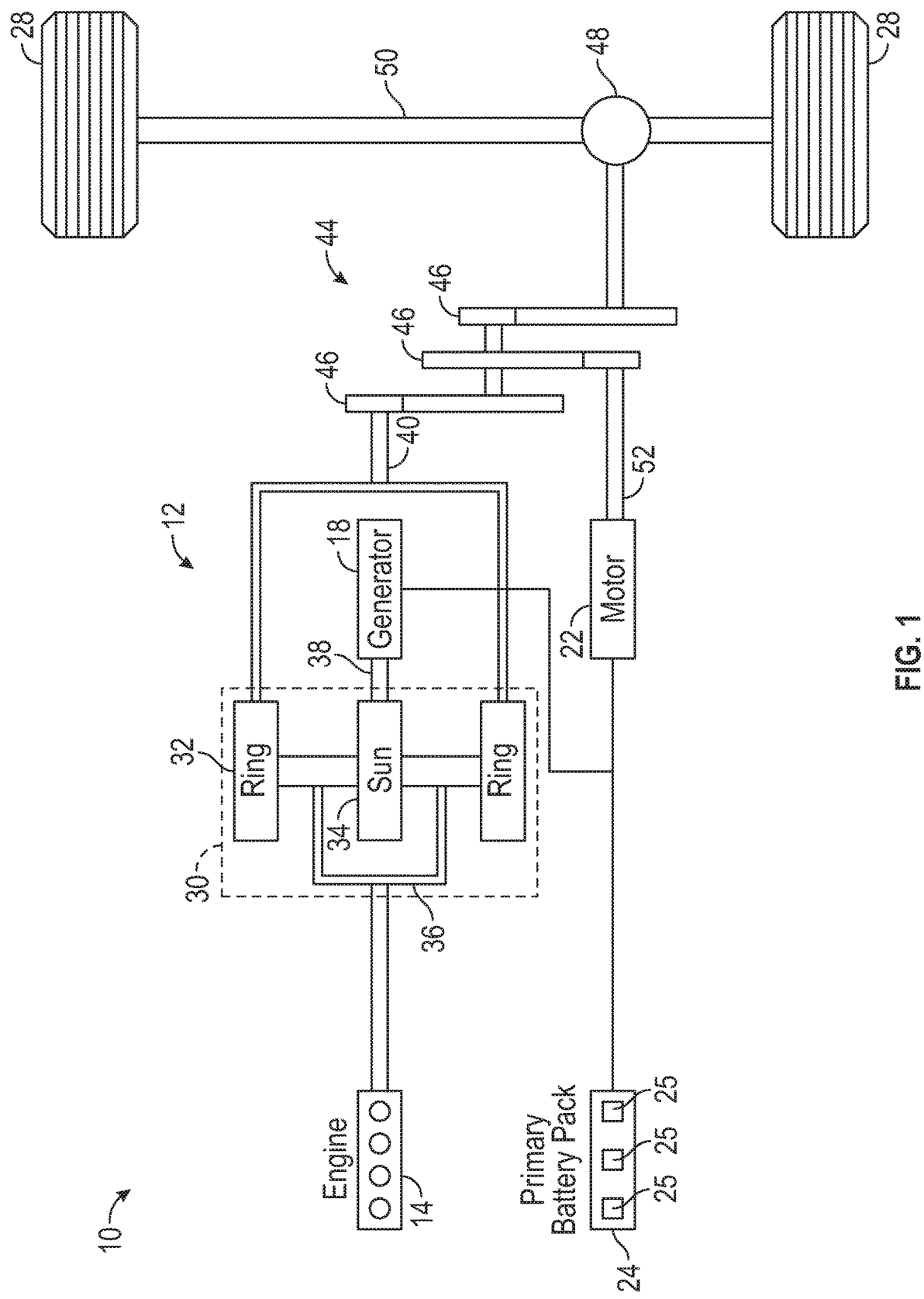
FIG. 1 schematically illustrates a powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEV's), battery electric vehicles (BEVs), fuel cell vehicles, etc.

In an embodiment, the powertrain 10 is a power-split powertrain system that employs first and second drive systems. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems are each capable of generating torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, or micro hybrids.

The engine 14, which may be an internal combustion engine, and the generator 18 may be connected through a power transfer unit 30, such as a planetary gear set. Of course, other types of power transfer units, including other gear sets and transmissions, may be used to connect the engine 14 to the generator 18. In a non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In a non-limiting embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In a non-limiting embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an exemplary electrified vehicle battery. The battery pack 24 may be a high voltage traction battery that includes a plurality of battery arrays 25 (i.e., battery assemblies or groupings of battery cells) capable of outputting electrical power to operate the motor 22, the generator 18, and/or other electrical loads of the electrified vehicle 12 for providing power to propel the wheels 28. Other types of energy storage devices and/or output devices could also be used to electrically power the electrified vehicle 12.

In an embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery pack 24 state of charge up to its maximum allowable discharging rate under certain driving patterns/cycles. The EV mode is an example of a charge depleting mode of operation for the electrified vehicle 12. During EV mode, the state of charge of the battery pack 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery pack 24 at a constant or approximately constant level by increasing the engine 14 propulsion. The electrified vehicle 12 may be operated in other operating modes in addition to the EV and HEV modes within the scope of this disclosure.

Figure 2:
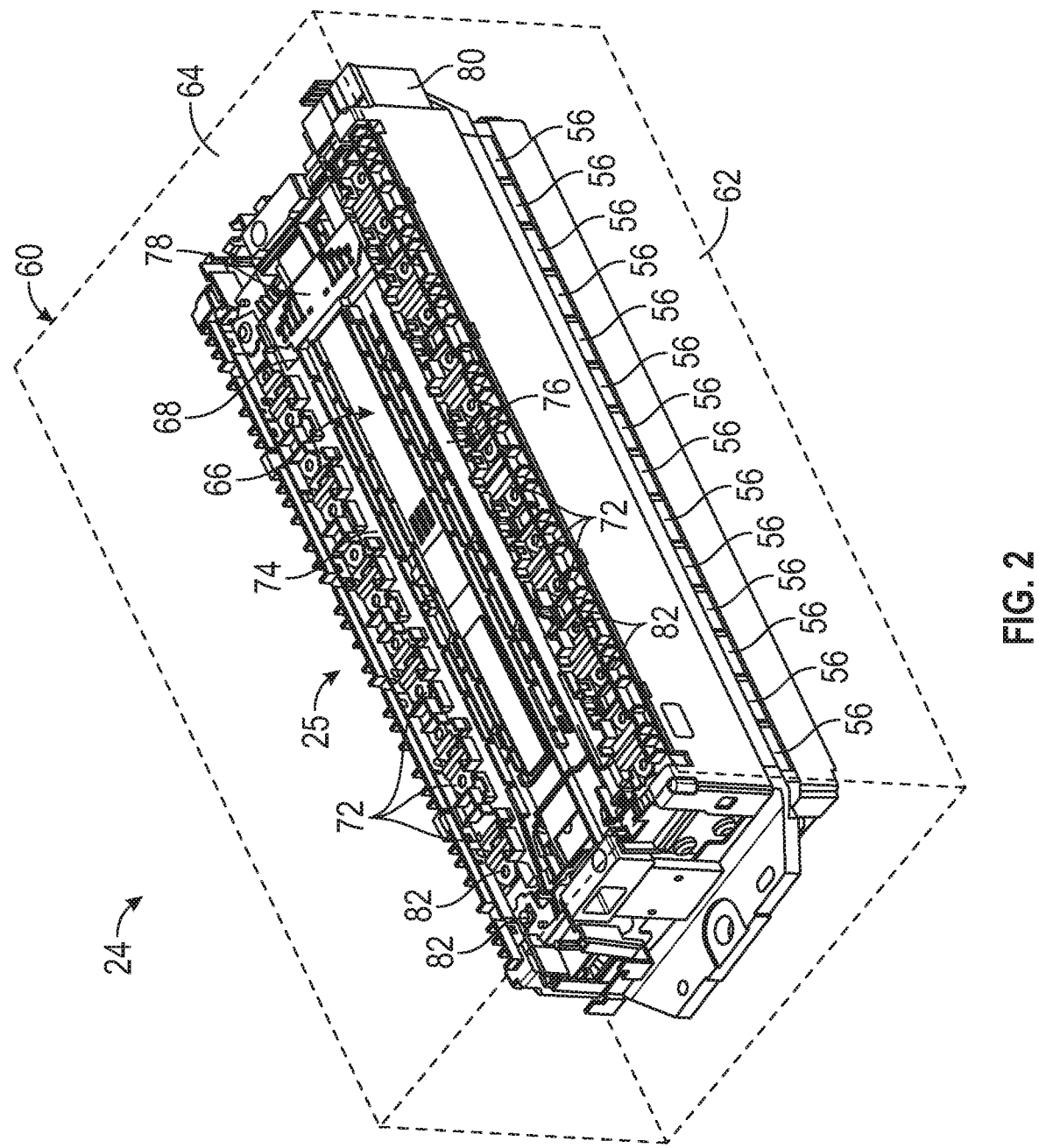
FIG. 2 illustrates a battery pack of an electrified vehicle.

FIG. 2 illustrates a battery pack 24 that can be employed within an electrified vehicle, such as the electrified vehicle 12 of FIG. 1. FIG. 2 is a perspective view of the battery pack 24, and certain components (e.g., an enclosure assembly 60) are shown in phantom lines to better illustrate the internal contents of the battery pack 24.

The battery pack 24 may house a plurality of battery cells 56 that store energy for powering various electrical loads of the electrified vehicle 12. The battery pack 24 could employ any number of battery cells 56 within the scope of this disclosure. Accordingly, this disclosure is not limited to the exact configuration shown in FIG. 2.

The battery cells 56 may be stacked side-by-side along one or more stack longitudinal axes to construct groupings of battery cells 56, sometimes referred to as a "cell stacks" or "cell arrays." In an embodiment, the battery cells 56 are prismatic, lithium-ion cells. However, battery cells having other geometries (cylindrical, pouch, etc.), other chemistries (nickel-metal hydride, lead-acid, etc.), or both could alternatively be utilized within the scope of this disclosure.

The battery cells 56 of each grouping, along with any support structures (e.g., array frames, spacers, rails, walls, plates, bindings, etc.), may collectively be referred to as a battery assembly or a battery array 25. The battery pack 24 depicted in FIG. 2 includes a single battery array 25; however, the battery pack 24 could include a greater number of battery arrays and still fall within the scope of this disclosure. Again, this disclosure is not limited to the specific configuration shown in FIG. 2.

Although not shown in the highly schematic depiction of FIG. 2, the battery pack 24 could additionally house one or more battery electronic components. The battery electronic components could include a bussed electrical center (BEC), a battery electric control module (BECM), wiring harnesses, wiring loops, I/O connectors, etc., or any combination of these battery electronic components.

An enclosure assembly 60 may house each battery array 25 of the battery pack 24. The enclosure assembly 60 may be a sealed housing that includes a tray 62 and a cover 64. The enclosure assembly 60 may include any size, shape, and configuration within the scope of this disclosure.

A circuit connector system 66 may be incorporated into the battery array 25 for electrically connecting the battery cells 56. The battery cells 56 may be connected in either a series string or a parallel string. The circuit connector system 66 could be snap fit, welded, bolted, clipped, or otherwise attached to one or more of the battery cells 56 or support structures (e.g., side walls, end walls, array frames, etc.) of the battery array 25. In an embodiment, the circuit connector system 66 is connected to and extends in span across top surfaces of the battery cells 56 of the battery array 25. However, other mounting locations are also contemplated.

In an embodiment, where the battery cells 56 are prismatic style battery cells, the circuit connector system 66 may be referred to a bus bar module. In another embodiment, where the battery cells 56 are pouch style battery cells, the circuit connector system 66 may be referred to as an interconnected bus bar (ICB) module.

The circuit connector system 66 may include a sense lead assembly 68. The sense lead assembly 68 establishes an integrated circuit for electrically connecting and balancing the voltage of the battery cells 56. The sense lead assembly 68 may also be configured to measure the voltages of each battery cell 56 and to deliver the voltage readings to a control module (see feature 70 of FIG. 3), such as a battery electronic control module (BECM), for further processing. For example, the control module may process the voltage readings for setting the appropriate power limits of the battery pack 24 and for monitoring the general health of each battery cell 56. As further detailed below, the sense lead assembly 68 may additionally incorporate features for providing circuit protection for each individual battery cell 56 of the battery array 25.

Figure 3:
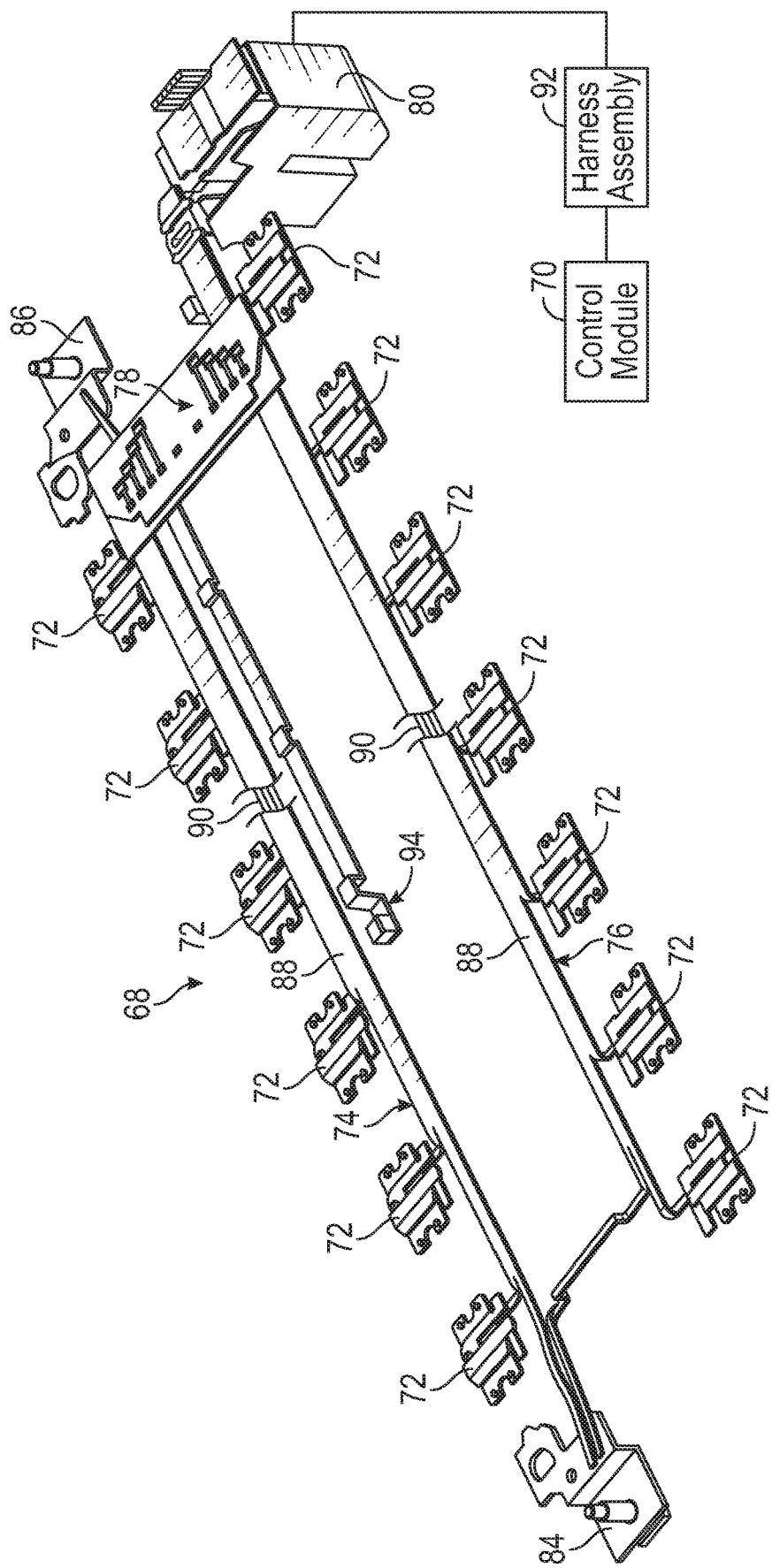
FIG. 3 illustrates an exemplary sense lead assembly of a battery array circuit connector system.

FIG. 3 further illustrates the exemplary sense lead assembly 68 of the circuit connector system 66 of FIG. 2. The sense lead assembly 68 may include a plurality of bus bars 72, a first wiring member 74 connected to a first portion of the plurality of bus bars 72, a second wiring member 76 connected to a second portion of the plurality of bus bars 72, a circuit board 78, and a sense lead connector 80. Each of these components is further detailed below.

The bus bars 72 may be connected to terminals 82 (see FIG. 2) of the battery cells 56. Each bus bar 72 electrically connects adjacent terminals 82 of adjacent battery cells 56. In an embodiment, the bus bars 72 connect adjacent terminals 82 that include opposite polarities (i.e., negative to positive or positive to negative).

The bus bars 72 may be stamped, relatively thin strips of metal that are configured to conduct the power stored by the battery cells 56. Example bus bar materials include copper, brass, or aluminum, although other conductive materials may also be suitable. In an embodiment, the bus bars 72 are high current bus bars having relatively high amperage capacities.

Each of the first and second wiring members 74, 76 may distribute the power from the battery cells 56 from the bus bars 72 to each of a high voltage positive (+) connector 84 and a high voltage negative (−) connector 86. The power can then be distributed as desired for powering the electrical loads of an electrified vehicle.

In an embodiment, the first and second wiring members 74, 76 are configured as flat flexible cables (FFCs). In another embodiment, the first and second wiring members 74, 76 are configured as flexible printed circuits (FPCs). The first and second wiring members 74, 76 may therefore include a relatively thin and flexible substrate 88. The substrate 88 may be made of a pliable (i.e., bendable) material. Non-limiting examples of such materials include polyimide (PI), Kapton®, polyester (PET), polyethylene napthalate (PEN), polyethermide (PEI), various fluropolymers (FEP) or copolymers, etc.

Each of the first and second wiring members 74, 76 may include one or more voltage sense leads 90. In an embodiment, the voltage sense leads 90 include copper traces. However, other conductive materials could be used to form the voltage sense leads 90.

The voltage sense leads 90 may be integrated on or into the substrate 88. For example, if the first and second wiring members 74, 76 are configured as FFCs, the voltage sense leads 90 may be over-molded inside the substrate 88, or if the first and second wiring members 74, 76 are configured as FPCs, the voltage sense leads 90 may be printed onto an exterior surface of the substrate 88. The voltage sense leads 90 may be applied to the substrate 88 using a variety of additive or subtractive techniques, including but not limited to, molding, printing, plating, etching, laminating, engraving, milling, ablation, etc.

The first and second wiring members 74, 76, and therefore the voltage sense leads 90, may extend between the bus bars 72 and the circuit board 78. In an embodiment, at least one voltage sense lead 90 extends between each bus bar 72 and the circuit board 78, which is centrally located between the first and second wiring members 74, 76. The circuit board 78 may be a printed circuit board (PCB), in an embodiment. In another embodiment, the circuit board 78 is made of a glass reinforced epoxy laminate material, such as FR-4, for example.

Figure 4:
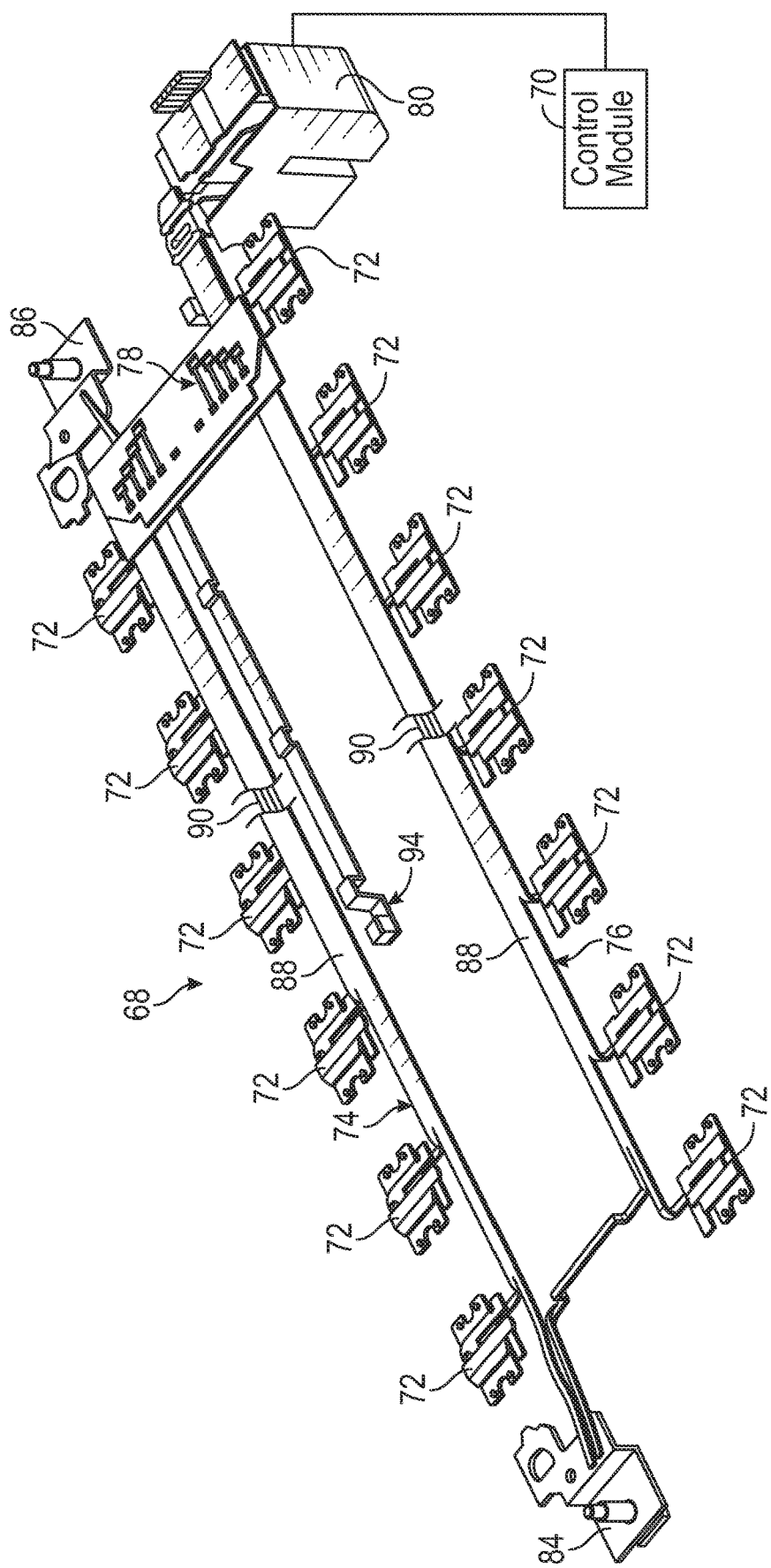
FIG. 4 illustrates another exemplary sense lead assembly of a battery array circuit connector system.

Once the sense lead assembly 68 is connected to the battery array 25 in the manner shown in FIG. 2, the voltage of each battery cell 56 may be measured by the voltage sense leads 90 of the first and second wiring members 74, 76. The voltage sense leads 90 may communicate voltage signals to the circuit board 78, which may be electrically connected to the sense lead connector 80. The sense lead connector 80 may be connected to an intermediate harness assembly 92 that is connected to the control module 70 (see FIG. 3). Alternatively, the sense lead connector 80 may connect directly to the control module 70 (see FIG. 4). The control module 70 may process the voltage signals for setting the appropriate power limits of the battery pack 24 and for monitoring the general health of each battery cell 56.

The sense lead assembly 68 may additionally include one or more thermistors 94. The thermistors 94 may monitor battery conditions, such as temperatures, of one or more of the battery cells 56 of the battery array 25. The thermistors 94 may exhibit changes in resistance in response to temperature changes of the battery cells 56. Information pertaining to any changes in resistance responsive to changes in temperature may be communicated to the sense lead connector 80 and then to the control module 70 for monitoring the health of the battery array 25, such as to avoid overcharging the battery cells 56, for example.

Figure 5:
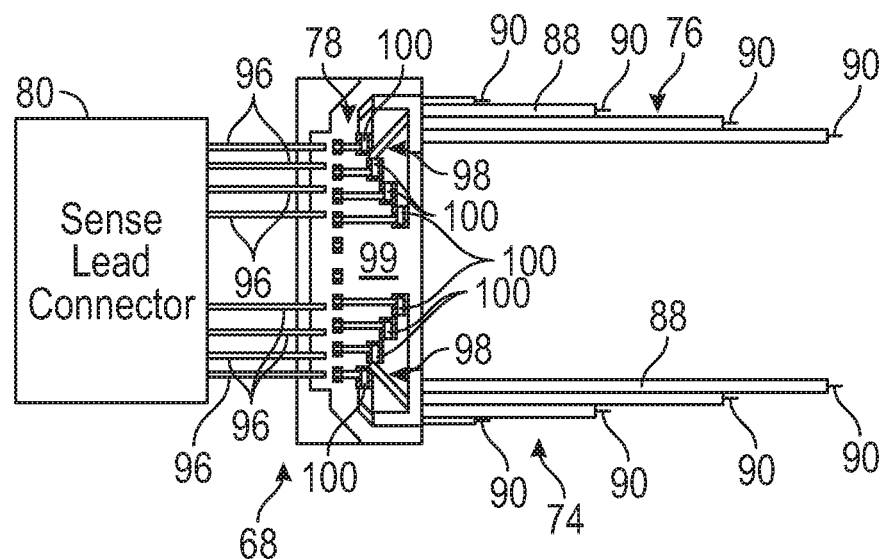
FIG. 5 illustrates a circuit board and other select portions of a sense lead assembly. The circuit board establishes a mounting surface for incorporating fuses into the sense lead assembly.

Referring now primarily to FIG. 5, the circuit board 78 may enable the transition from the first and second wiring members 74, 76 of the sense lead assembly 68 to additional wires 96 that enable the connection of the circuit board 78 to the sense lead connector 80. The additional wires 96 may be standard wires, FFCs, FPCs, etc.

Due to the differences in the material make-ups of the voltage sense leads 90 and the circuit board 78, a transition area 98 may be provided on the circuit board 78 for connecting the voltage sense leads 90 to the circuit board 78. The transition area 98 may be established by solder, weld beads, terminal connectors, etc.

A fuse 100 may be provided in each individual sense lead circuit in order to protect the battery array 25 against accidental short circuit events. Individual fusing is generally not possible within the first and second wiring members 74, 76 because the substrate 88 does not permit attachment or soldering of the fuses 100. However, the centrally mounted circuit board 78 provides a suitable mounting surface 99 for incorporating the fuses 100 into the sense lead assembly 68. In an embodiment, the total number of fuses 100 mounted on the circuit board 78 is equal to the total number of voltage sense leads 90 provided within the first and second wiring members 74, 76. In the event of a relatively high current event, the fuses 100 may operate to break the sense lead circuit and prevent over-current and any associated damage of the battery cells 56.

The centralized mounting location of the fuses 100 on the circuit board 78 allows for simple and efficient servicing of the battery array 25. For example, subsequent to an over-current event, a blown fuse can simply be removed from the circuit board 78 and replaced without the need to remove the battery pack 24 from the vehicle or perform any other complex servicing methods.

Figure 6:
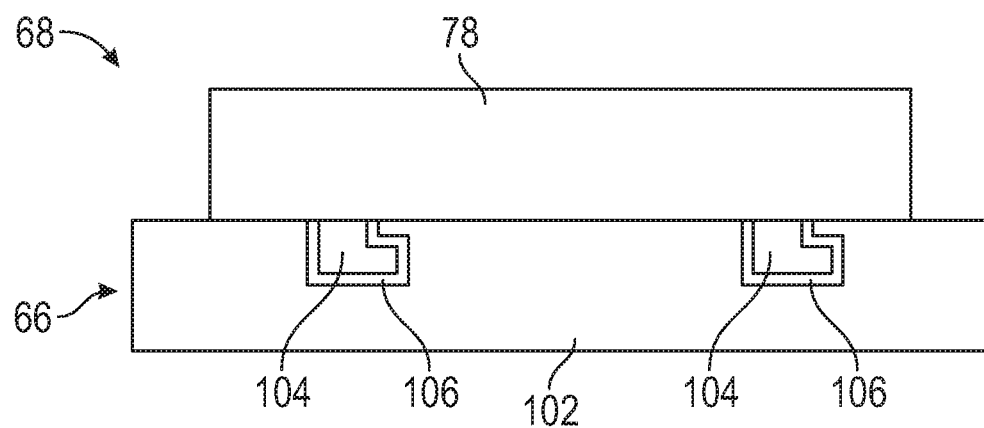
FIG. 6 illustrates exemplary retention features for securing a circuit board of a sense lead assembly to a carrier of a circuit connector system.

FIG. 6 illustrates an exemplary connection of the circuit board 78 of the sense lead assembly 68 to a carrier 102 of the circuit connector system 66. In an embodiment, the carrier 102 is a plastic housing of the circuit connector system 66. The circuit board 78 may be snapped (e.g., clipped) into the carrier 102. In an embodiment, the circuit board 78 includes one or more flexible retention arms 104. The flexible retention arms 104 may be positioned within openings 106 formed in the carrier 102 for retaining the circuit board 78 relative to the carrier 102.

The exemplary battery packs of this disclosure incorporate sense lead fusing directly into the sense lead assembly design. The centrally mounted circuit board of the sense lead assembly provides a suitable mounting point for sense lead fuses that was not possible in prior art designs. The centrally mounted circuit board may also eliminate wiring routing issues by changing the order of the signals from input to output. The centralized fusing, in combination with the battery array top surface mounting location of the sense lead assembly, further allows for simple and reliable servicing of the battery array in response to overcurrent conditions.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A battery array, comprising:
a grouping of battery cells; and
a sense lead assembly connected to the grouping of battery cells, wherein the sense lead assembly includes:
a first wiring member including a first voltage sense lead;
a second wiring member including a second voltage sense lead;
a printed circuit board (PCB) connected to the first and second wiring members,
wherein the PCB is comprised of a first material and the first and second wiring members are comprised of a second, different material;
a first removable fuse mounted to the PCB and connected to the first voltage sense lead at a first side of a transition area of the circuit board;
a second removable fuse mounted to the PCB and connected to the second voltage sense lead;
a sense lead connector;
a first additional wire connecting the sense lead connector to the PCB at a second side of the transition area of the circuit board; and
a second additional wire connecting the sense lead connector to the PCB near the second removable fuse.

2. The battery array as recited in claim 1, wherein the first wiring member is configured as a flat flexible cable or a flexible printed circuit.

3. The battery array as recited in claim 2, wherein the first voltage sense lead extends inside the flat flexible cable or is applied on an external surface of the flexible printed circuit.

4. The battery array as recited in claim 1, wherein the first wiring member connects between the PCB and a plurality of bus bars.

5. The battery array as recited in claim 1, wherein the sense lead connector connects to an intermediate harness assembly or directly to a control module.

6. The battery array as recited in claim 1, wherein the PCB includes at least one flexible retention arm for securing the PCB to a plastic carrier of a circuit connector system.

7. The battery array as recited in claim 1, wherein the first voltage sense lead extends between a bus bar and the first removable fuse.

8. The battery array as recited in claim 1, wherein the sense lead assembly includes at least one thermistor.

9. The battery array as recited in claim 1, wherein the PCB is centrally mounted between the first wiring member and the second wiring member.

10. The battery array as recited in claim 1, wherein the sense lead assembly is a component of a circuit connector system that is mounted at a top surface of a battery array.

11. The battery array as recited in claim 1, wherein the first wiring member is connected to each of a high voltage positive connector and a high voltage negative connector.

* * * * *